(12) United States Patent
Miyashita

(10) Patent No.: US 6,765,841 B2
(45) Date of Patent: Jul. 20, 2004

(54) SEMICONDUCTOR MEMORY DEVICE AND ELECTRONIC INSTRUMENT

(75) Inventor: Koji Miyashita, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 75 days.

(21) Appl. No.: 10/294,466

(22) Filed: Nov. 14, 2002

(65) Prior Publication Data
US 2003/0107941 A1 Jun. 12, 2003

(30) Foreign Application Priority Data
Nov. 14, 2001 (JP) ........................................ 2001-349263

(51) Int. Cl.$^7$ ................................................. G11C 8/00
(52) U.S. Cl. ............... 365/230.03; 365/63; 365/230.01; 365/185.11; 365/185.13; 365/230.06
(58) Field of Search ....................... 365/230.03, 230.06, 365/63, 230.01, 185.11, 185.13

(56) References Cited

U.S. PATENT DOCUMENTS

| | | | | | |
|---|---|---|---|---|---|
| 5,463,577 | A | * | 10/1995 | Oowaki et al. | 365/63 |
| 5,966,340 | A | * | 10/1999 | Fujino et al. | 365/230.03 |
| 6,044,028 | A | * | 3/2000 | Tomohiro et al. | 365/200 |
| 6,088,286 | A | * | 7/2000 | Yamauchi et al. | 365/230.06 |
| 6,111,799 | A | * | 8/2000 | Uchida | 365/200 |
| 6,201,745 | B1 | * | 3/2001 | Ryu et al. | 365/200 |
| 6,249,477 | B1 | * | 6/2001 | Ohtsuki | 365/200 |
| 6,493,284 | B2 | * | 12/2002 | Kim | 365/230.06 |
| 6,625,053 | B2 | * | 9/2003 | Takashima | 365/145 |
| 6,661,734 | B2 | * | 12/2003 | Inaba et al. | 365/230.06 |
| 2001/0024384 | A1 | * | 9/2001 | Arimoto et al. | 365/200 |
| 2001/0048631 | A1 | * | 12/2001 | Wada et al. | 365/230.03 |
| 2003/0048678 | A1 | * | 3/2003 | Lee et al. | 365/200 |

* cited by examiner

Primary Examiner—Viet Q. Nguyen
(74) Attorney, Agent, or Firm—Hogan & Hartson LLP

(57) ABSTRACT

A highly integrated semiconductor memory device capable of operating at high speed having a plurality of main word lines which extend along a first direction across memory blocks, and sub word lines disposed in each of the memory blocks and subordinate to each of the main word lines. Sub row decoders are provided corresponding to the memory blocks. Each of the sub row decoders has a plurality of sub word select signal lines extending along a second direction and selects one of the sub word lines. First and second signal supply sections, which supply sub word select signals to the sub word select signal lines disposed in the sub row decoders, are provided on either end in the first direction. A block select signal line extending in the sub row decoder along the second direction is connected with the second signal supply section. The second signal supply section generates the sub word select signal based on the potential of the block select signal line.

20 Claims, 13 Drawing Sheets

SEMICONDUCTOR MEMORY DEVICE AND ELECTRONIC INSTRUMENT

Japanese Patent Application No. 2001-349263, filed on Nov. 14, 2001, is hereby incorporated by reference in its entirety.

BACKGROUND OF THE INVENTION

The present invention relates to a semiconductor memory device such as an SRAM and an electronic instrument using the same. More particularly, the present invention relates to a semiconductor memory device capable of achieving an increase in the degree of integration and an increase in speed, and an electronic instrument using the same. In more detail, the present invention relates to improvement for driving a sub word line at high speed.

In this type of semiconductor memory device, an increase in the degree of integration and an increase in speed have been demanded. The number of memory cells is increased in the vertical direction and the horizontal direction if the degree of integration is increased.

If the number of memory cells in the horizontal direction is increased, the number of memory cells directly connected with one word line is increased. This results in an increase in load resistance and load capacitance of one word line, whereby the word line cannot be selectively driven at high speed.

Therefore, the memory cell array is divided into blocks in the horizontal direction and a plurality of main word lines is disposed across a plurality of memory blocks. A plurality of sub word lines subordinate to each of the plurality of main word lines is disposed in each of the plurality of memory blocks. The load capacitance of one main word line is decreased in this manner.

If the number of memory cells in the vertical direction is increased, it is difficult to selectively drive the sub word line at high speed. A plurality of sub word select signal lines for selecting one of the plurality of sub word lines in each memory block is disposed along the vertical direction. If the number of memory cells is increased in the vertical direction, the length of the plurality of sub word select signal lines is increased in the vertical direction, whereby load resistance and load capacitance are increased. Therefore, it is difficult to selectively drive the sub word line at high speed due to rounding of the waveform of sub word select signals supplied to the plurality of sub word select signal lines.

BRIEF SUMMARY OF THE INVENTION

The present invention may provide a semiconductor memory device enabling high integration and high speed, and an electronic instrument using the same.

The present invention may also provide a semiconductor memory device which enables a sub word line to be selectively driven at high speed by decreasing waveform rounding of a sub word select signal supplied to a sub word select signal line. and an electronic instrument using the same.

One aspect of the present invention provides a semiconductor memory device comprising:

a memory cell array;

a plurality of main word lines extending along a first direction in the memory cell array;

a row decoder which selects one of the main word lines;

a plurality of memory blocks formed by dividing the memory cell array in a first direction;

a plurality of sub word lines disposed in each of the plurality of memory blocks and subordinate to each of the main word lines;

a plurality of sub row decoders respectively provided for the memory blocks, each of the sub row decoders having a plurality of sub word select signal lines extending along a second direction which intersects the first direction to select one of the sub word lines;

a first signal supply section which is disposed on one end in the second direction and supplies a plurality of sub word select signals to the sub word select signal lines in each of the sub row decoders; and a second signal supply section which is disposed on the other end in the second direction and supplies the sub word select signals to the sub word select signal lines in each of the sub row decoders.

According to this aspect of the present invention, the sub word select signals at an active potential are supplied from the first signal supply section connected to one end of the sub word select signal lines and the second signal supply section connected with the other end of the sub word select signal lines. Therefore, even if load capacitance and load resistance of the sub word select signal lines are increased by an increase in the degree of integration, charging or discharging until the sub word select signal lines reach the active potential is not delayed.

According to another aspect of the present invention, there is provided an electronic instrument comprising the above semiconductor memory device. The performance of the electronic instrument is improved by having such a highly-integrated semiconductor memory device capable of operating at high speed.

DETAILED DESCRIPTION OF THE EMBODIMENTS

Figure 1:
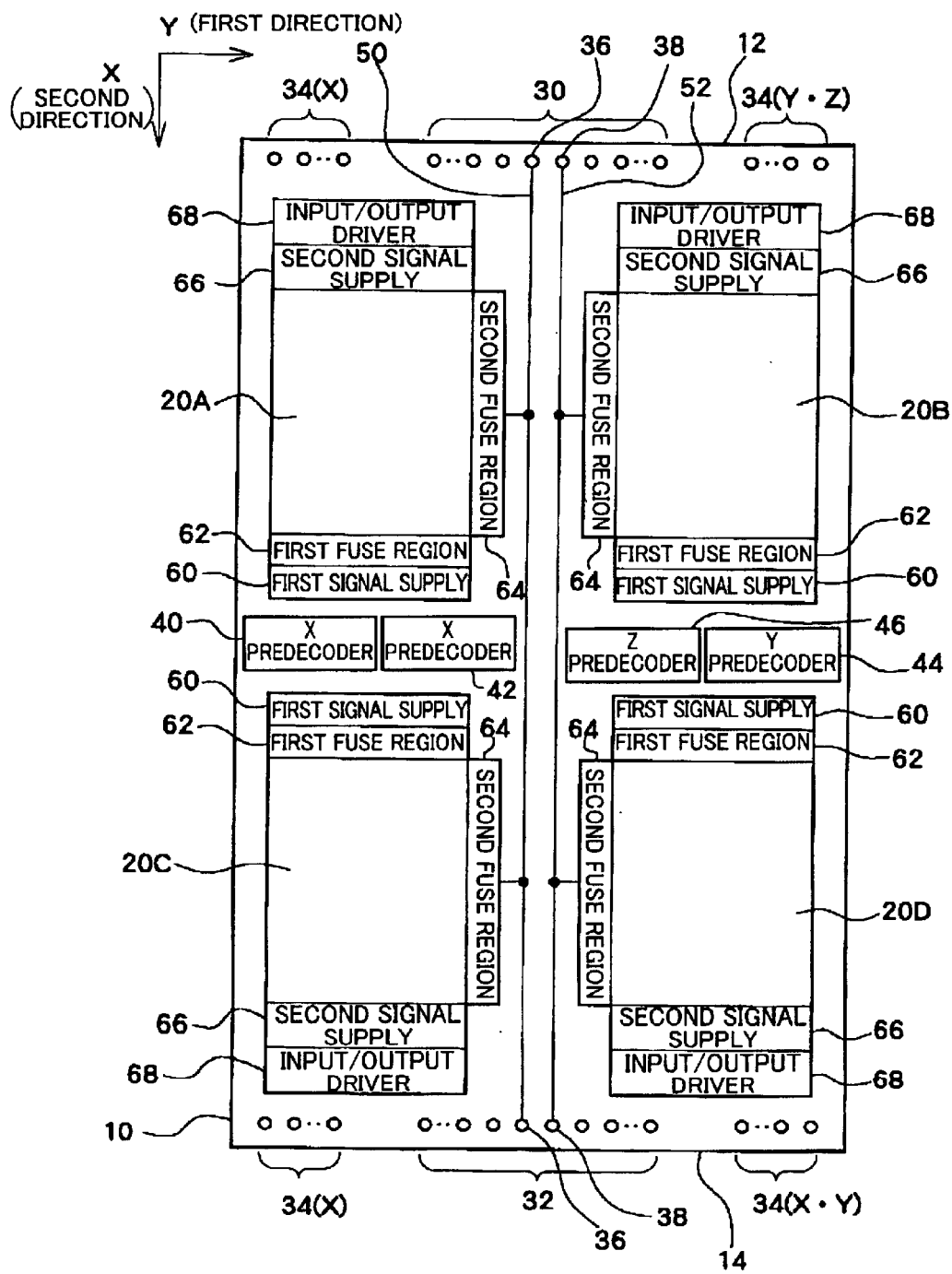
FIG. 1 is a planar layout diagram of a semiconductor memory device according to one embodiment of the present invention.

According to one embodiment of the present invention, there is provided a semiconductor memory device comprising:

a memory cell array;

a plurality of main word lines extending along a first direction in the memory cell array;

a row decoder which selects one of the main word lines;

a plurality of memory blocks formed by dividing the memory cell array in a first direction;

a plurality of sub word lines disposed in each of the plurality of memory blocks and subordinate to each of the main word lines;

a plurality of sub row decoders respectively provided for the memory blocks, each of the sub row decoders having a plurality of sub word select signal lines extending along a second direction which intersects the first direction to select one of the sub word lines;

a first signal supply section which is disposed on one end in the second direction and supplies a plurality of sub word select signals to the sub word select signal lines in each of the sub row decoders; and a second signal supply section which is disposed on the other end in the second direction and supplies the sub word select signals to the sub word select signal lines in each of the sub row decoders.

According to this embodiment of the present invention, the sub word select signals at an active potential are supplied from the first signal supply section connected to one end of the sub word select signal lines and the second signal supply section connected with the other end of the sub word select signal lines. Therefore, even if load capacitance and load resistance of the sub word select signal lines are increased by an increase in the degree of integration, charging or discharging until the sub word select signal lines reach the active potential is not delayed.

In this case, a block select signal line may be provided along the second direction for each of the sub row decoders, the block select signal line being set to an active potential in response to selection of one of the memory blocks corresponding to each of the sub row decoders. The block select signal line is used to drive a sense amplifier, a bitline driver section (write driver), and the like.

The second signal supply section may set one of the sub word select signal lines provided for one of the sub row decoders to the active potential, based on logic between the block select signal line provided in the sub row decoder and a plurality of predecoded signal lines used to select one of the sub word lines. Since the block select signal line is provided in the sub row decoder for the above-described reason, the second signal supply section can be driven by utilizing the block select signal line.

The sub word select signal lines may be cut at a given position in the second direction.

This is because the signals can be supplied from the first and second signal supply sections connected on either end of the sub word select signal lines.

A first length from the first signal supply section to the cutting position may be different from a second length from the second signal supply section to the cutting position.

In this case, the first length may be determined based on the size of a transistor which makes up the first signal supply section, and load resistance and load capacitance of the sub word select signal lines having the first length. Similarly, the second length may be determined based on the size of a transistor which makes up the second signal supply section and load resistance and load capacitance of the sub word select signal line having the second length.

The resistance value per unit length of the sub word select signal lines may be set higher in a region between the first signal supply section and the sub row decoders than other regions.

For example, if a plurality of fuse elements for switching from a defective memory cell to a redundant memory cell are disposed between the first signal supply section and the sub row decoders, each of the sub word select signal lines has a high resistance layer which is disposed below the fuse elements to avoid contact with the fuse elements. Therefore, load to the block select signal line having the first length is increased. In such a case, the first length may be shorter than the second length.

The second signal supply section may have a self-amplifying circuit which self-amplifies the potential of the block select signal line. This self-amplifying circuit sets the block select signal line at the active potential based on the potential change on the block select signal line.

The self-amplification used herein refers to allowing the block select signal line to be charged or discharged to the active potential based on the potential change on the block select signal line toward the active potential.

Since the block select signal line connected to the second signal supply section is wired in the sub row decoder, the length of the block select signal line is increased, whereby waveform rounding easily occurs. In this case, however, the self-amplification can hasten when the block select signal line reaches the active potential. As a result, the sub word line can be selectively driven at high speed even in the case of a highly-integrated semiconductor memory device, whereby data can be written or read at high speed.

The self-amplifying circuit may include:

a first potential setting section which sets the block select signal line at the active potential;

a first switching element provided between the first potential setting section and the block select signal line; and a first switch control section which turns ON or OFF the first switching element based on the potential change on the block select signal line.

The active potential can be supplied to the block select signal line from the first potential setting section by allowing the first switching element to be turned ON by the first switch control section.

The self-amplifying circuit may also include:

a second potential setting section which sets the block select signal line at a non-active potential; and a second switching element provided between the second potential setting section and the block select signal line, the second switching element being turned ON within a predetermined time period at least before the first switching element is turned ON.

The block select signal line can be reset to the non-active potential before self-amplification by turning ON the second switching element. This prevents malfunction of the self-amplifying circuit due to charges remaining in the block select signal line.

The self-amplifying circuit may further include a third switching element provided between the first switching element and the block select signal line, the third switching element being turned OFF within a time period in which the second switching element is turned ON.

This configuration prevents a through current from flowing between the first potential setting section and the second potential setting section through the first and second switching elements.

The second switching element of the self-amplifying circuit may be turned ON based on an address transition detection signal which becomes active for a predetermined time period every time an address for selecting a memory cell in the memory cell array is changed.

This enables the block select signal line to be reset to the non-active potential in all the memory blocks.

The first switch control section may include a first inverter which logically inverts the potential of the block select signal line; and the first switching element may include a first transistor, an output of the first inverter being supplied to a gate of the first transistor.

The output of the first inverter varies in the process in which the block select signal is set to the active potential. The first transistor is turned ON based on the varied output of the first inverter, whereby a self-amplification operation can be achieved.

The current drive capability of the first transistor may be higher than the current drive capability of a transistor which forms the first inverter.

This configuration makes it possible to shorten the self-amplification time until the block select signal line is set to the active potential.

The self-amplifier circuit may further include a second switch control section which turns ON or OFF the second switching element based on the potential change on the block select signal line.

This enables the block select signal line to be reset to the non-active potential by the second switch control section which operates based on the potential change of the block select signal line without using other signal lines.

The second switch control section may include a second inverter which logically inverts the potential of the block select signal line; and the second switching element may include a second transistor, an output of the second inverter being supplied to a gate of the second transistor.

The output of the second inverter varies in the process in which the block select signal line is set to the non-active potential. The second transistor is turned ON based on the varied output of the second inverter, whereby the block select signal line can be reset to the non-active potential.

The current drive capability of the second transistor may be higher than the current drive capability of a transistor which forms the second inverter.

This enables to shorten a reset time until the block select signal line reaches the non-active potential.

The logic level of the first inverter may be lower than the logic level of the second inverter.

This enables the time of control performed by the first and second switch control sections to be different from each other while allowing the first and second switch control sections to respectively control the first and second switching elements based on the potential change of the same block select signal line. The first switch control section enables the first transistor to be turned ON at an early stage when the potential of the block select signal line is changed to the active potential. The second switch control section enables the second transistor to be turned ON at an early stage when the potential of the block select signal line is changed to the non-active potential.

Another embodiment of the present invention relates to an electronic instrument comprising the above-described semiconductor memory device. The performance of the electronic instrument can be improved by having the highly-integrated semiconductor memory device capable of operating at high speed.

Various embodiments of the present invention will be further described below in more detail with reference to the drawings.

Semiconductor Memory Device

FIG. 1 is a view showing an example of a planar layout of a semiconductor memory device according to an embodiment of the present invention. This semiconductor memory device is an SRAM (Static Random Access Memory), for example. A semiconductor memory device 10 shown in FIG. 1 has four memory cell arrays 20A, 20B, 20C, and 20D. The storage capacity of each of the memory cell arrays 20A to 20D is 4 Mbits, for example. The total storage capacity is 4 Mbits×4=16 Mbits. The present invention may be applied to a semiconductor memory device having one memory cell array.

The semiconductor memory device 10 is capable of writing or reading 16-bit (two bytes) data at the same time, for example. Higher-order eight bits (higher-order byte) of data is read from or written into the memory cell arrays 20A and 20B on the upper side in FIG. 1 through input/output terminals 30 disposed along an upper side 12 of the semiconductor memory device 10. Lower-order eight bits (lower-order byte) of data is read from or written into the memory cell arrays 20C and 20D on the lower side in FIG. 1 through input/output terminals 32 disposed along a lower side 14 of the semiconductor memory device 10.

20-bit address signals (X, Y, Z) for writing or reading 16-bit data at the same time are input through address terminals 34 disposed along the upper side 12 and the lower side 14 of the semiconductor memory device 10. The X, Y, and Z address signals input through the address terminals 34 are predecoded by X predecoders 40 and 42, Y predecoder 44, and Z predecoder 46 disposed in the center region of the semiconductor memory device 10.

The memory cell arrays 20A and 20C disposed on the left of the semiconductor memory device 10 are connected with a first power supply line 50 to which power is supplied through power supply terminals 36. The memory cell arrays 20B and 20D disposed on the right of the semiconductor memory device 10 are connected with a second power supply line 52 to which power is supplied through power supply terminals 38. In the present embodiment, two memory cell arrays connected with the same power supply line are not selected at the same time when writing or reading higher-order and lower-order 8-bit data at the same time. Therefore, the memory cell arrays 20A and 20D are selected at the same time, or the memory cell arrays 20B and 20C are selected at the same time.

Command terminals and the like are also disposed along the upper side 12 and the lower side 14 of the semiconductor memory device 10 in addition to the terminals 30, 34, 36, and 38.

In each of the memory cell arrays 20A to 20D, a first signal supply section 60 and a first fuse region 62 are disposed on the side near the predecoders 40 to 46, and a second signal supply section 66 and an input/output driver circuit 68 are disposed on the side near the upper side 12 or the lower side 14. A second fuse region 64 is disposed in each of the memory cell arrays 20A to 20D on the side near the power supply lines 50 and 52.

A plurality of fuse elements for switching from a defective memory cell to a redundant memory cell is arranged in the first fuse region 62. A plurality of fuse elements for cutting the power supply to the defective memory cell is arranged in the second fuse region 64.

Memory Cell Array

Figure 2:
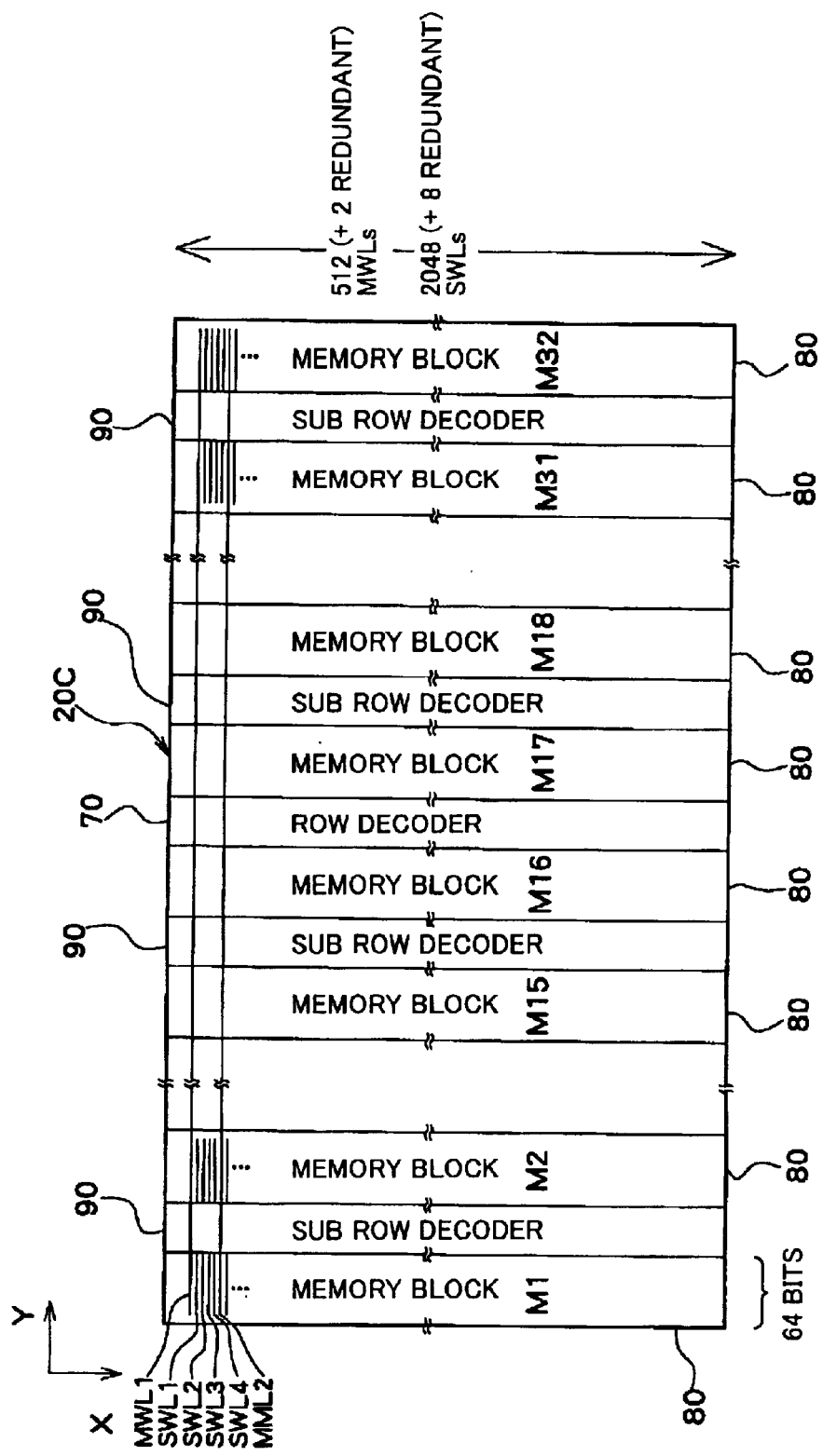
FIG. 2 is a diagram schematically showing one memory cell array of FIG. 1.

FIG. 2 is a schematic explanatory diagram showing a common configuration of the memory cell arrays 20A to 20D. In FIG. 2, the memory cell array 20C includes a row decoder 70 at the center in the Y direction (first direction), for example. The memory cell array 20C is divided into 16 blocks on each side of the row decoder 70. Therefore, the memory cell array 20C has 32 divided memory blocks (M1 to M32) 80 in total.

The storage capacity of one memory block 80 is 64 bits (Y direction)×2048 bits (X direction)=128 kbits. The total storage capacity of the 32 memory blocks 80 is 4 Mbits. A sub row decoder 90 is disposed between two memory blocks 80 and shared by the two memory blocks 80. Therefore, 16 sub row decoders 90 are provided in total. One sub row decoder 90 may be disposed for each of the memory blocks 80.

In the memory cell array 20C, 512 main word lines MWL1, MWL2, . . . are provided along the Y direction over almost the entire width in the Y direction, for example. The memory cell array 20C also includes two redundant main word lines.

Four sub word lines SWL1 to SWL4 subordinate to each of the 512 main word lines MWL are provided in each of the 32 memory blocks 80. Therefore, 2048 sub word lines SWL are provided in total. Each of the 32 memory blocks 80 further includes eight redundant sub word lines subordinate to two redundant main word lines.

The X and Y address signals respectively designate the addresses in the X and Y directions shown in FIGS. 1 and 2. The Z address signal selects one of the 32 memory blocks 80, for example.

The row decoder 70 selects one of the 512 main word lines MWL based on an X predecoded signal. The sub row decoder 90 selects one of the four sub word lines SWL1 to SWL4 subordinate to the selected one main word line MWL in one memory block 80. A Z predecoded signal (block select signal ZSB) and lower-order four bits of the X predecoded signal are used to select one of the four sub word lines SWL1 to SWL4.

As described above, 8-bit data is written into or read from one memory block 80 by selecting one sub word line SWL and allowing the input/output driver circuit 68 to select a pair of bitlines for eight bits based on the Y and Z predecoded signals. In the present embodiment, two of the four memory cell arrays 20A to 20D are selected at the same time and 8-bit data is written into or read from one memory block 80 in each of the two memory cell arrays (16-bit data in total) at the same time.

Sub Row Decoder

Figure 3:
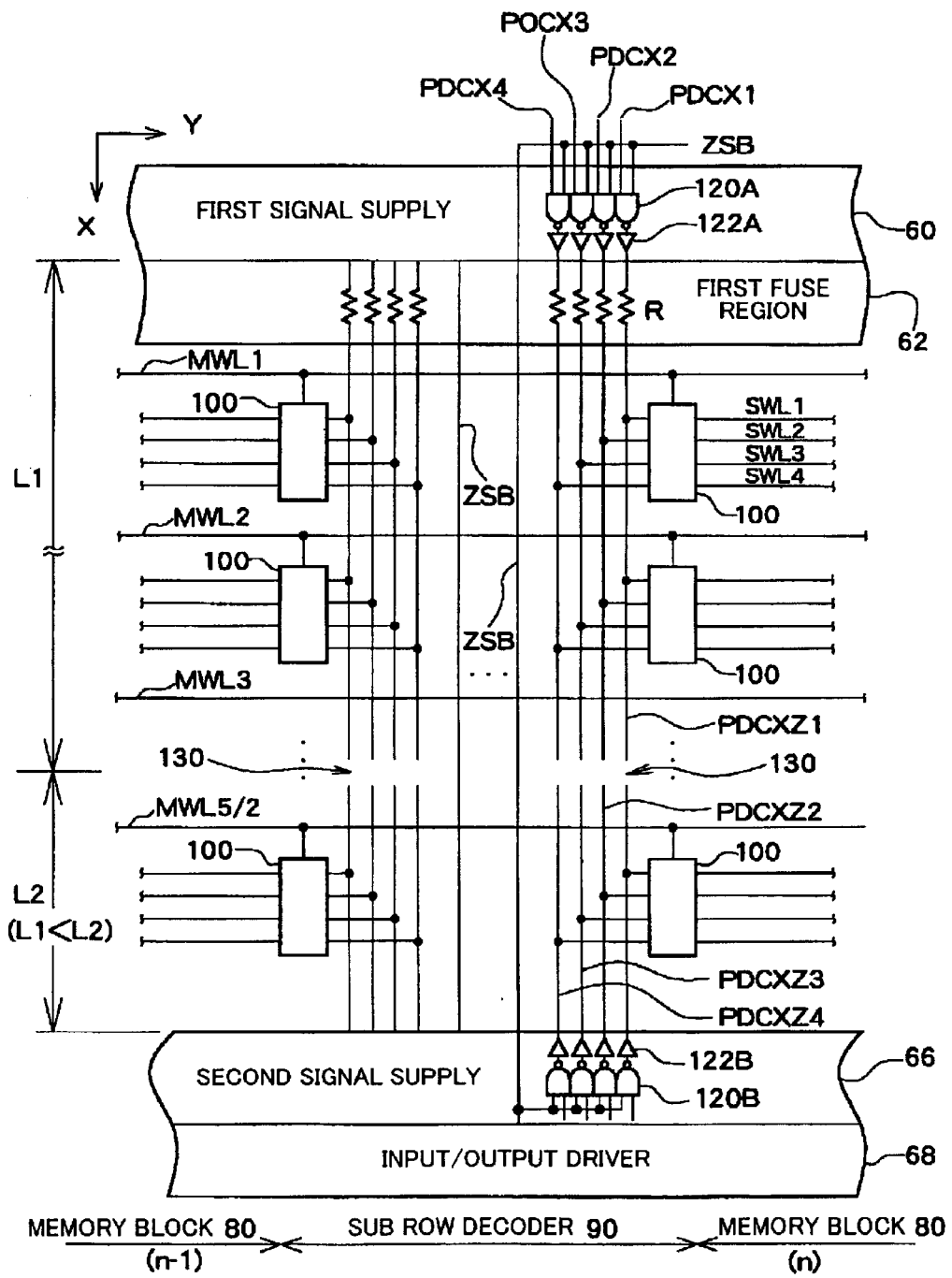
FIG. 3 is a circuit diagram showing details of a sub row decoder and first and second signal supply sections shown in FIG. 2.

FIG. 3 is a view showing details of the sub row decoder 90 shared by the (n−1)th and nth memory blocks 80. A common configuration for selecting the sub word lines SWL1 to SWL4 in the (n−1)th and nth memory blocks 80 is described below.

In the sub row decoder 90, four sub word select signal lines (X & Z predecoded signal lines) PDCXZ1 to PDCXZ4 extend along the X direction (second direction). High active sub word select signals are supplied to the four sub word select signal lines PDCXZ1 to PDCXZ4. As shown in FIG. 3, each of the sub word select signals is generated based on the block select signal ZSB (low active), which is the Z address signal predecoded by the Z predecoder 46, and lower-order four bits of the X predecoded signals PDCX1 to PDCX4 (low active), which are the X address signals predecoded by the X predecoders 40 and 42. In the sub row decoder 90, the block select signal line ZSB extends along the X direction and reaches the input/output driver circuit 68. The block select signal line ZSB is used to drive a sense amplifier, a Y driver (bitline driver), and the like in the input/output driver circuit 68.

512 switches 100 are provided for selecting one sub word line SWL from the 512 main word lines MWL1 to MWL512 and the four sub word select signal lines PDCXZ1 to PDCXZ4.

Figure 4:
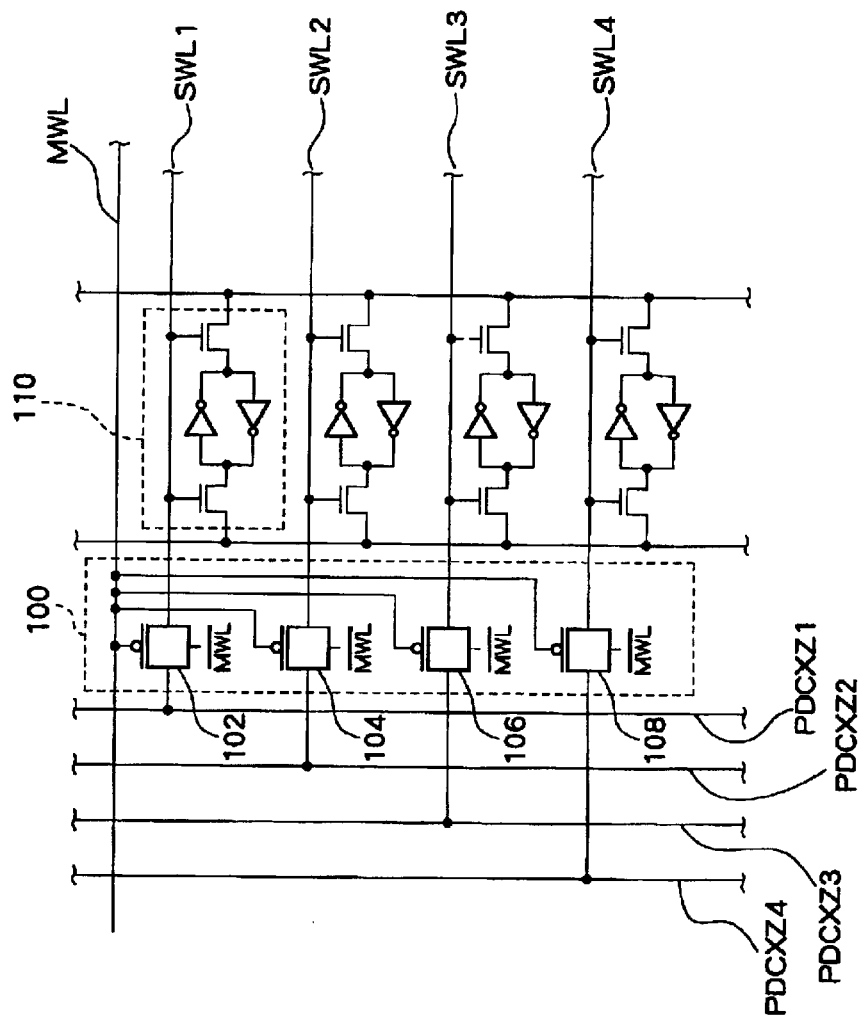
FIG. 4 is a circuit diagram showing the relationship between switches, main word lines, sub word lines, and sub word select signal lines shown in FIG. 3.

As shown in FIG. 4, each of the switches 100 includes four transfer gates 102, 104, 106, and 108. Each of the transfer gates 102, 104, 106, and 108 switches connection/disconnection between one of the four sub word select signal lines PDCXZ and one sub word line SWL corresponding thereto based on logic between the main word line MWL and an inverted main word line/MWL. In the present embodiment, a low active main word select signal is supplied to the main word line MWL.

In the case where the potential of the main word line MWL1 is LOW, the potential of the sub word select signal line PDCXZ1 is HIGH, and the potentials of other sub word select signal lines PDCXZ2 to PDCXZ4 are LOW, the potential of the sub word line SWL1 subordinate to the main word line MWL1 becomes HIGH. As a result, data can be written into or read from the memory cells 110 connected with the sub word line SWL1.

High-Speed Drive of Sub Word Line

The number of memory cells in the X direction shown in FIG. 3 is increased as the degree of integration of the memory is increased. This results in an increase in the lengths of the four sub word select signal lines PDCXZ1 to PDCXZ4 shown in FIG. 3 in the X direction, whereby load resistance and load capacitance are increased. Therefore, a first reason that it is difficult to selectively drive the sub word line SWL at high speed is due to rounding of the waveform of the sub word select signal supplied to the sub word select signal line PDCXZ.

A second reason is that the first fuse region 62 shown in FIGS. 1 and 3 is present between the first signal supply section 60 and the sub row decoder 90.

In the present embodiment, the sub word select signal lines PDCXZ1 to PDCXZ4 are formed by a second metal layer (aluminum layer), for example. However, since the fuse elements of the first fuse region 62 are formed in the same layer as the second metal layer, the sub word select signal lines PDCXZ1 to PDCXZ4 are formed by a layer which detours below the first fuse region 62 such as a polysilicon layer. This results in an increase in the length of the sub word select signal lines PDCXZ1 to PDCXZ4. Moreover, the material for the detouring layer has a resistance higher than the second metal layer. Therefore, the sub word select signal lines PDCXZ1 to PDCXZ4 have a high resistance R due to detouring of the first fuse region 62, as shown in FIG. 3. This further increases load resistance of the sub word select signal lines PDCXZ1 to PDCXZ4.

Second Signal Supply Section

As shown in FIGS. 1 and 3, the first signal supply section 60 is connected with one end of the sub word select signal lines PDCXZ1 to PDCXZ4, and the second signal supply section 66 is connected with the other ends of the sub word select signal lines PDCXZ1 to PDCXZ4.

Figure 5:
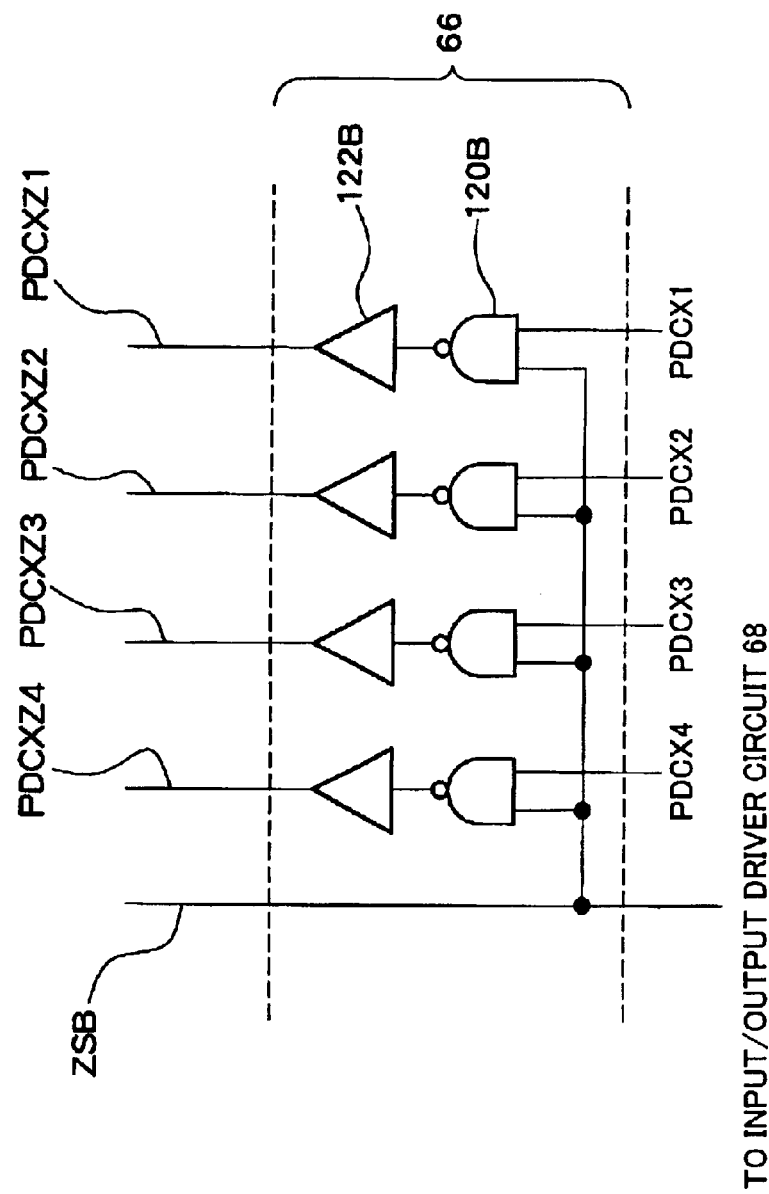
FIG. 5 is a circuit diagram showing part of the second signal supply section of FIG. 4.

The first and second signal supply sections 60 and 66 have the same circuit configuration and merely differ from each other in the target to be routed. FIG. 5 is a view showing details of the second signal supply section 66. As shown in FIGS. 3 and 5, the first and second signal supply sections 60 and 66 are formed by connecting a NAND gate and a driver with each of the four sub word select signal lines PDCXZ1 to PDCXZ4. Specifically, the first signal supply section 60 includes four NAND gates 120A and four drivers 122A. The second signal supply section 66 includes four NAND gates 120B and four drivers 122B. Lower-order four bits of the X predecoded signals PDCX1 to PDCX4 (low active) which are the X address signals predecoded by the X predecoders 40 and 42 are input to first input terminals of the four NAND gates 120A and the four NAND gates 120B. The block select signal line ZSB (low active) is connected in common with second input terminals of the four NAND gates 120A and the four NAND gates 120B.

The block select signal line ZSB is connected with the first signal supply section 60 from the Z predecoder which predecodes the Z address signal. The block select signal line ZSB formed to extend in the sub row decoder 90 along the Y direction is connected with the second signal supply section 66.

In the second signal supply section 66, each of the four sub word select signal lines PDCXZ1 to PDCXZ4 can be driven by utilizing the block select signal line ZSB passing through the sub row decoder 90. Therefore, it is unnecessary to route the block select signal line ZSB only for the second signal supply section 66.

Figure 6:
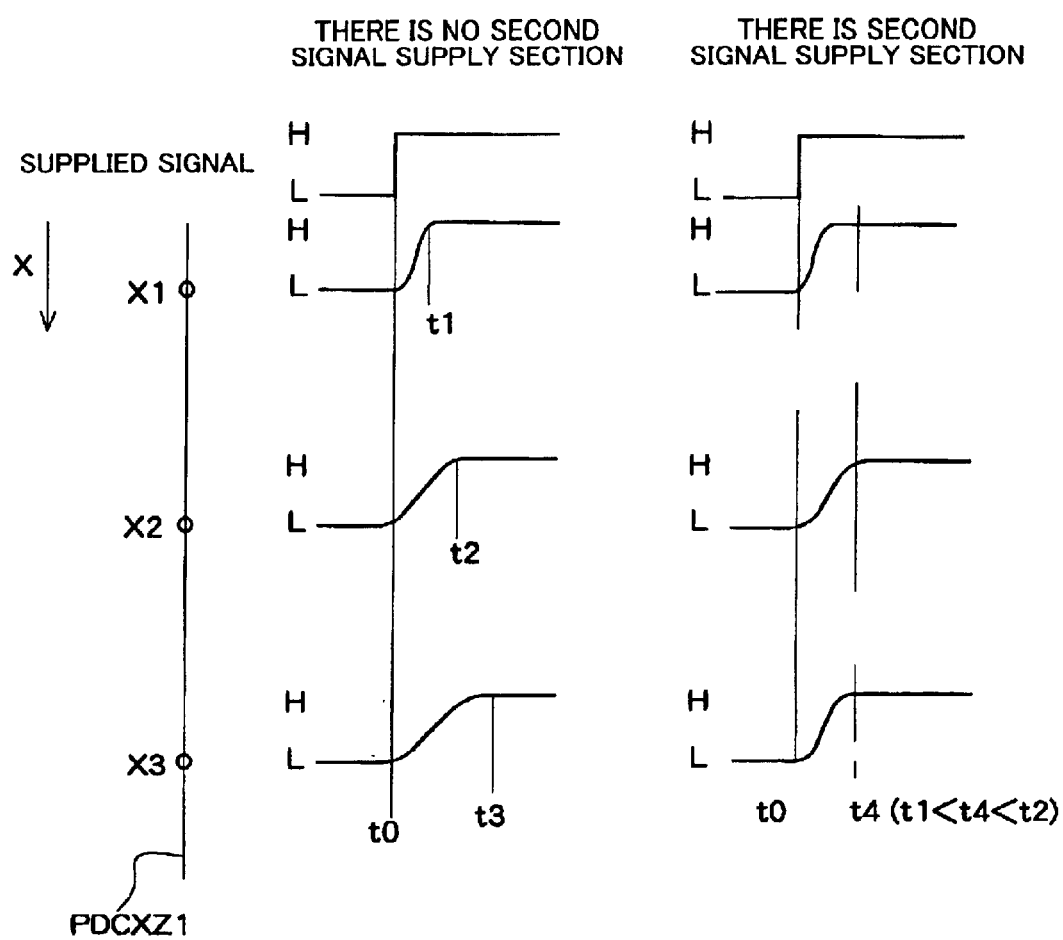
FIG. 6 is a waveform diagram showing potential changes at various positions of the sub word select signal lines in X direction when the second signal supply section of FIG. 5 is not provided and when the second signal supply section is provided.

The operation of the second signal supply section 66 is described below. As shown in FIG. 6, the sub word select signal which is changed from the non-active potential (L) to the active potential (H) at a time t0 is supplied only to the sub word select signal line PDCXZ1, for example.

FIG. 6 shows potential changes at the positions X1, X2, and X3 of the sub word select signal line PDCXZ1 in the X direction when the second signal supply section 66 is provided and when the second signal supply section 66 is not provided. As shown in FIG. 6, if the second signal supply section 66 is not provided, a time required to allow the potential to rise to the HIGH potential is increased in the order from t1, t2, and t3 (t1<t2<t3) depending upon the position in the X direction as the distance from the first signal supply section 60 is increased.

If the second signal supply section 66 is provided, signals are supplied from each end of the sub word select signal line PDCXZ1. Therefore, the sub word select signal line PDCXZ1 is rapidly charged to a potential Vdd which is the active potential.

As a result, the intermediate point X2 of the sub word select signal line PDCXZ1 is charged at last. The intermediate point X2 reaches the potential vdd at a time t4 shown in FIG. 6. However, the time t4 can be less than the charge completion time t2 with no self-amplification by an effect the same as that of both-side drive.

Cutting of Sub Word Select Signal Line

As shown in FIG. 3, each of the four sub word select signal lines PDCXZ1 to PDCXZ4 may be cut at a halfway position (cutting position) 130 in the X direction. As a result, the sub word select signal lines having a first length L1 shown in FIG. 3 are driven by the first signal supply section 60, and the sub word select signal lines having a second length L2 are driven by the second signal supply section 66.

The first length L1 from the first signal supply section 60 to the cutting position 130 may differ from the second length L2 from the second signal supply section 66 to the cutting position 130. In the present embodiment, the first length L1 and the second length L2 are designed so that L1<L2, in which L1=(L1+L2)/3 and L2=2×(L1+L2)/3, for example.

The reasons are as follows. The first length L1 is determined based on balance between the size of a transistor which makes up the driver 122A in the first signal supply section 60 and load resistance and load capacitance of the sub word select signal line having the first length L1. The second length L2 is determined based on balance between the size of a transistor which makes up the driver 122B in the second signal supply section 66 and load resistance and load capacitance of the sub word select signal lines having the second length L2.

Specifically, the size of the transistors which make up the drivers 122A and 122B is a factor which determines current drive capability. The load resistance and load capacitance of the sub word select signal lines are a total load of interconnects driven by the drivers 122A and 122B. The load resistance and load capacitance are increased as the length of the sub word select signal line is increased. Therefore, periods of time necessary for charging two sub word select signal lines divided in the X direction to the active potential differ if the balance between the size of the transistor and load resistance and load capacitance of the sub word select signal line is missed.

In the present embodiment, a PMOS which makes up the driver 122A in the first signal supply section 60 has a comparatively large channel width/channel length of 120 μm/60 μm. A PMOS which makes up the driver 122B in the second signal supply section 66 has a small channel width/channel length of 40 μm/20 μm.

The reasons are as follows. The resistance value per unit length of the sub word select signal line between the first signal supply section 60 and the sub row decoder 90 is set higher than the resistance value per unit length in other regions. The high resistance value R increases load resistance of the sub word select signal line having the first length L1 (see FIG. 3).

The size of the PMOS which makes up the driver 122A in the first signal supply section 60 must be larger than the above value. However, since the circuit layout area is limited, the size of the PMOS transistor must be determined within the limitation. Since the current drive capability in the first signal supply section 60 is determined according to the size of the PMOS, the first length L1 of the sub word select signal line is determined as described above corresponding to the size of the PMOS.

The second length L2 is inevitably determined if the first length L1 is determined. Therefore, the size of the PMOS which makes up the driver 122B in the second signal supply section 66 is determined corresponding to the load of the second length L2.

EXAMPLE 1 OF SELF-AMPLIFYING CIRCUIT

The block select signal line ZSB connected with the second signal supply section 66 is formed to extend in the sub row decoder 90 along the X direction. Therefore, waveform rounding of the block select signal input to the second signal supply section 66 occurs due to the length of the signal line in comparison with the block select signal input to the first signal supply section 60.

Figure 7:
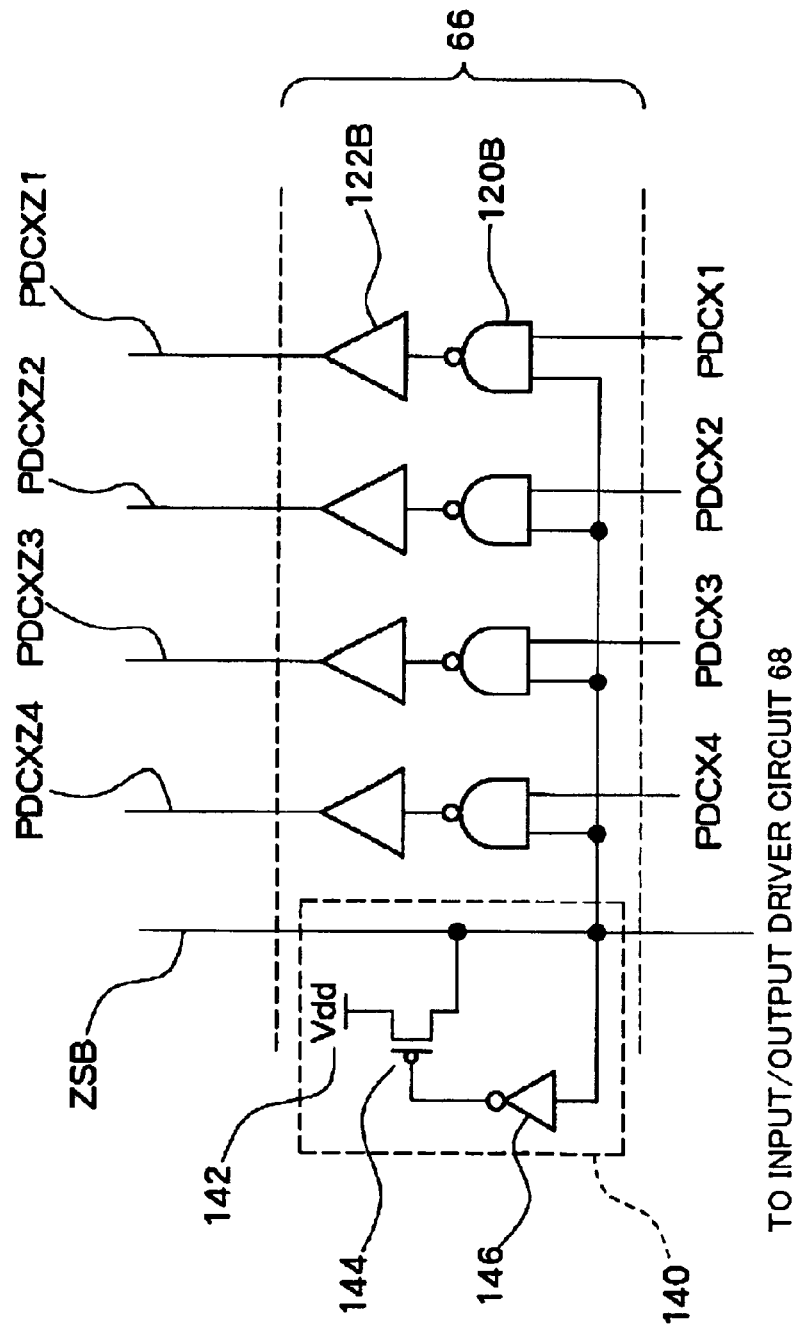
FIG. 7 is a circuit diagram showing Example 1 of a self-amplifying circuit for the block select signal line.

Therefore, in order to reduce the waveform rounding, the second signal supply section 66 preferably includes a self-amplifying circuit 140 which causes the potential of the block select signal line ZSB to be self-amplified, as shown in FIG. 7.

The self-amplifying circuit 140 supplies the active potential to the block select signal line ZSB based on the change in the potential of the block select signal line ZSB when the block select signal line ZSB is set at the active potential (Vdd, for example).

The self-amplifying circuit 140 shown in FIG. 7 includes a first potential setting section 142 which supplies the active potential (Vdd, for example) of the block select signal ZSB, a first switching element (first PMOS, for example) 144 provided between the first potential setting section 142 and the block select signal line ZSB, and a first switch control section (first inverter, for example) 146 which turns ON or OFF the first switching element 144 based on the change in the potential of the block select signal line ZSB.

When the block select signal line ZSB is at the non-active potential such as a LOW potential (0 V, for example), the output of the first inverter 146 becomes HIGH, whereby the first PMOS 144 is turned OFF. Therefore, the potential Vdd which is the active potential is not supplied to the block select signal line ZSB, whereby the block select signal line ZSB is maintained at the non-active potential (0 V).

The inverter which makes up the first switch control section 146 is generally formed by a CMOS transistor. One PMOS is used for the CMOS inverter 146. In this case, current drive capability of the first PMOS 144 halfway along a Vdd supply path is preferably set higher than that of the PMOS in the CMOS inverter 146. This enables the period of time necessary for causing the block select signal line ZSB to be self-amplified to the potential Vdd to be decreased.

EXAMPLE 2 OF SELF-AMPLIFYING CIRCUIT

Figure 8:
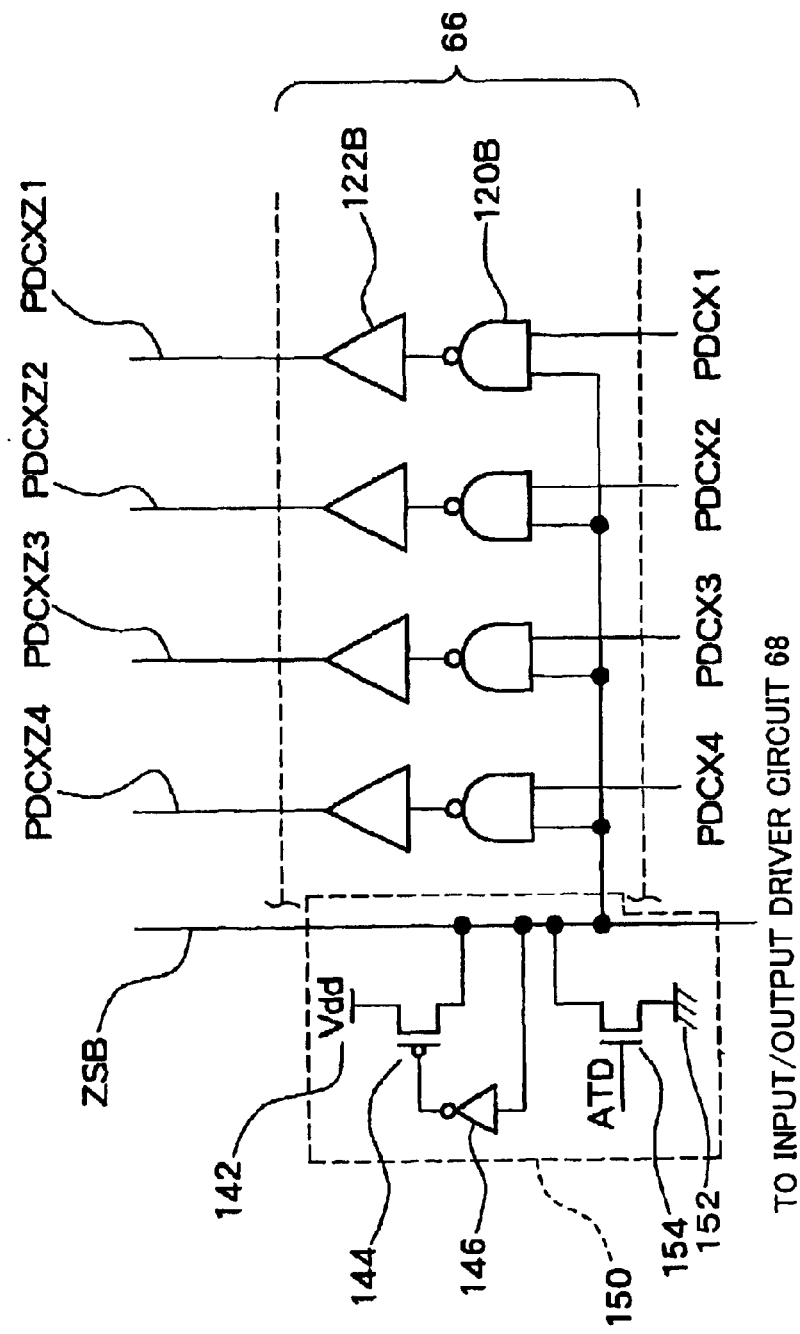
FIG. 8 is a circuit diagram showing Example 2 of the self-amplifying circuit for the block select signal line.

FIG. 8 is a view showing a self-amplifying circuit 150 differing from the self-amplifying circuit shown in FIG. 7. In the self-amplifying circuit 150 shown in FIG. 8, a grounding path is provided separately from the Vdd supply path of the self-amplifying circuit 140 shown in FIG. 7.

A second potential setting section (GND) 152 which sets the block select signal line ZSB at the non-active potential (0 V, for example), and a second switching element (NMOS, for example) 154 formed between the GND 152 and the block select signal line ZSB are provided in the grounding path.

The second switching element (NMOS) 154 is turned ON during a predetermined time period before the first switching element (PMOS) 144 is turned ON. In this example, an X address transition detection signal (ATD) is supplied to a gate of the NMOS 154.

Figure 9:
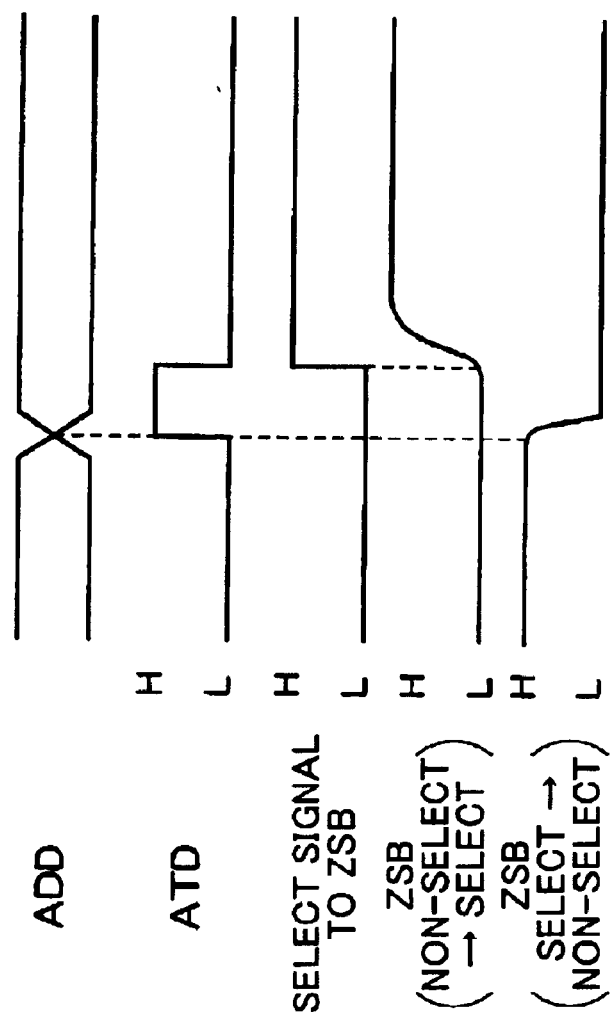
FIG. 9 is a timing chart for illustrating operations of the self-amplifying circuit of FIG. 8.

FIG. 9 is a timing chart for describing the operation of the self-amplifying circuit 150 shown in FIG. 8. As shown in FIG. 9, when transition of the X address ADD occurs, the address transition detection signal ATD at LOW becomes HIGH for a predetermined time period.

Therefore, the NMOS 154 shown in FIG. 8 is turned ON. As a result, the block select signal line ZSB in a selected state is reset to the LOW potential (0 V). The block select signal line ZSB in a non-selected state is maintained at the LOW potential.

When the signal input to the block select signal line ZSB to be selected is changed to the active potential (HIGH) as shown in FIG. 9, the output of the first inverter 146 in the self-amplifying circuit 150 is changed from HIGH to LOW, whereby the block select signal line ZSB is self-amplified to the active potential Vdd through the first PMOS 144.

Malfunction of the self-amplifying circuit 150 due to charges remaining in the block select signal line ZSB can be reliably prevented by resetting the block select signal line ZSB to LOW in this manner.

In this case, current drive capability of the NMOS 154 halfway along the grounding path is preferably set higher than that of the NMOS in the CMOS inverter 146. This reduces the period of time necessary for causing the block select signal line ZSB to be discharged to the grounding potential.

EXAMPLE 3 OF SELF-AMPLIFYING CIRCUIT

Figure 10:
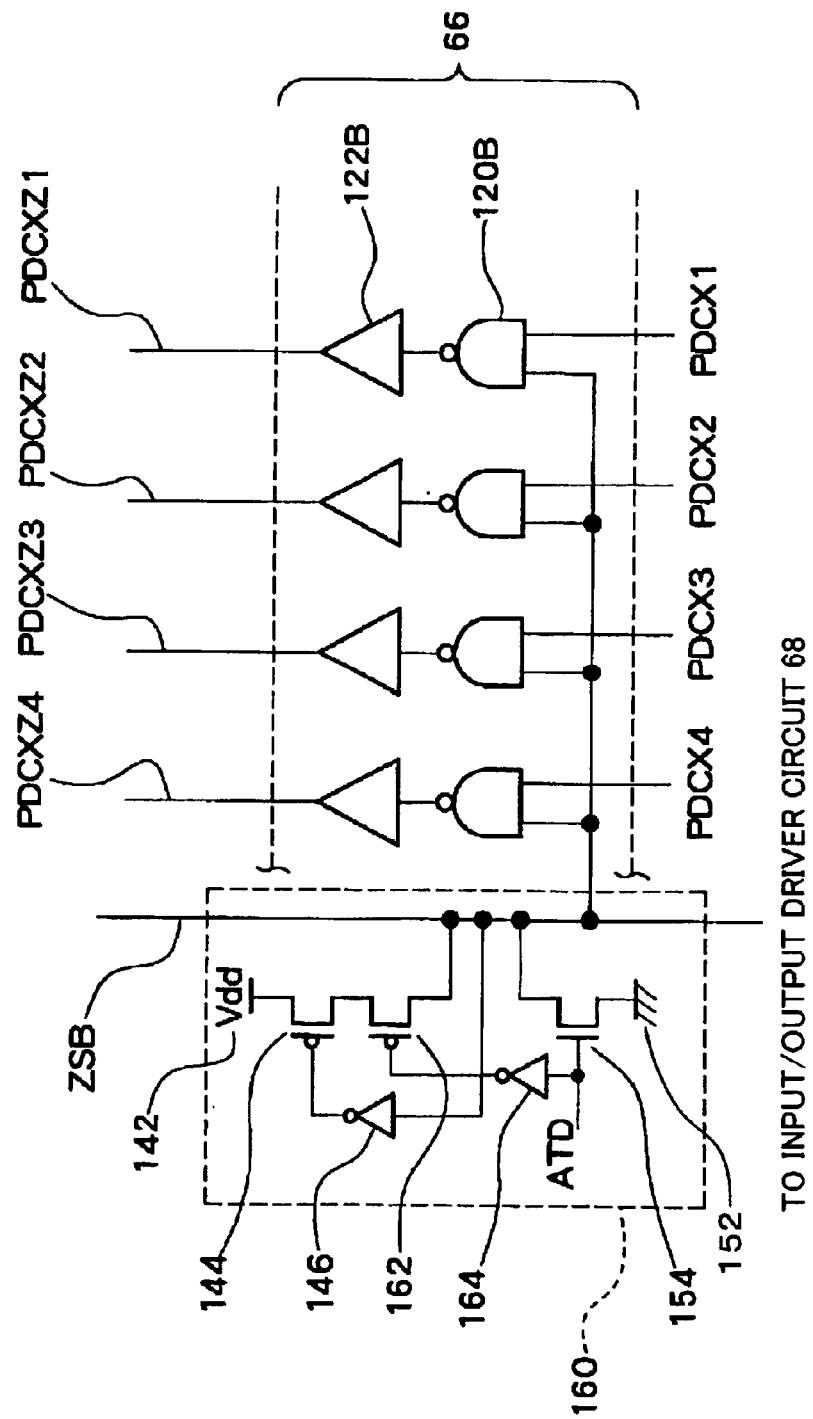
FIG. 10 is a circuit diagram showing Example 3 of the self-amplifying circuit for the block select signal line.

FIG. 10 is a view showing a self-amplifying circuit 160 differing from the self-amplifying circuit shown in FIG. 8. In the self-amplifying circuit 160 shown in FIG. 10, a third switching element (second PMOS, for example) 162 is provided in the Vdd supply path of the self-amplifying circuit 150 shown in FIG. 8.

The second PMOS 162 is turned OFF during a period in which the NMOS 154 is turned ON, thereby preventing a through current from flowing into the GND 152 from the Vdd power supply 142.

In this example, an inverter 164 which inverts the potential of the address transition detection signal line ATD is connected with the gate of the NMOS 154.

EXAMPLE 4 OF SELF-AMPLIFYING CIRCUIT

Figure 11:
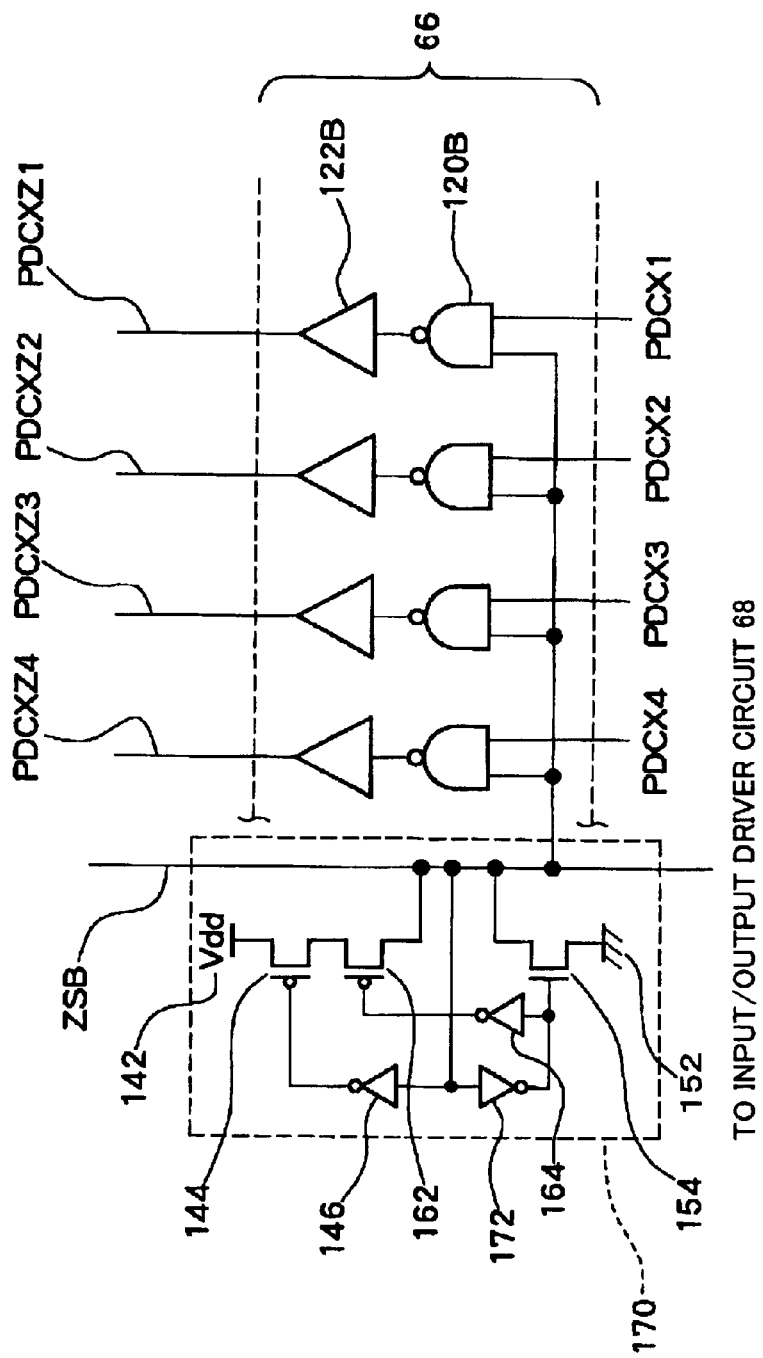
FIG. 11 is a circuit diagram showing Example 4 of the self-amplifying circuit for the block select signal line.

FIG. 11 is a view showing a self-amplifying circuit 170 differing from the self-amplifying circuit shown in FIG. 10. In the self-amplifying circuit 160 shown in FIG. 10, the address transition detection signal line ATD is connected with the gate of the NMOS 154. In the self-amplifying circuit 170 shown in FIG. 11, an output line of a second switch control section (second inverter, for example) 172 which inverts the potential of the block select signal line ZSB is connected with the gate of the NMOS 154. This additional configuration may also be applied to FIG. 8.

The first PMOS 144 is turned ON when the potential of the block select signal line ZSB reaches or exceeds a first logic level $V_{L1}$ at which the first inverter 146 is set by the HIGH potential output from the first inverter 146, whereby self-amplification is started.

The NMOS 154 is turned ON when the potential of the block select signal line ZSB is equal to or below a second logic level $V_{L2}$ at which the second inverter 172 is set by the LOW potential output from the second inverter 172, whereby the block select signal line ZSB is reset to LOW.

A smooth self-amplification operation can be realized by setting the first logic level $V_{L1}$ lower than the second logic level $V_{L2}$.

Specifically, the first inverter 146 enables the first PMOS 144 to be turned ON at an initial stage when the potential of the block select signal line ZSB is changed to the active potential. The second inverter 172 enables the NMOS 154 to be turned ON at an initial stage when the potential of the block select signal line ZSB is changed to the non-active potential. The period of time necessary for allowing the block select signal line ZSB to become LOW can be decreased by setting the current drive capability of the NMOS 154 higher than the current drive capability of the NMOS transistor which makes up the second inverter 172.

Electronic Instrument

Figure 12:
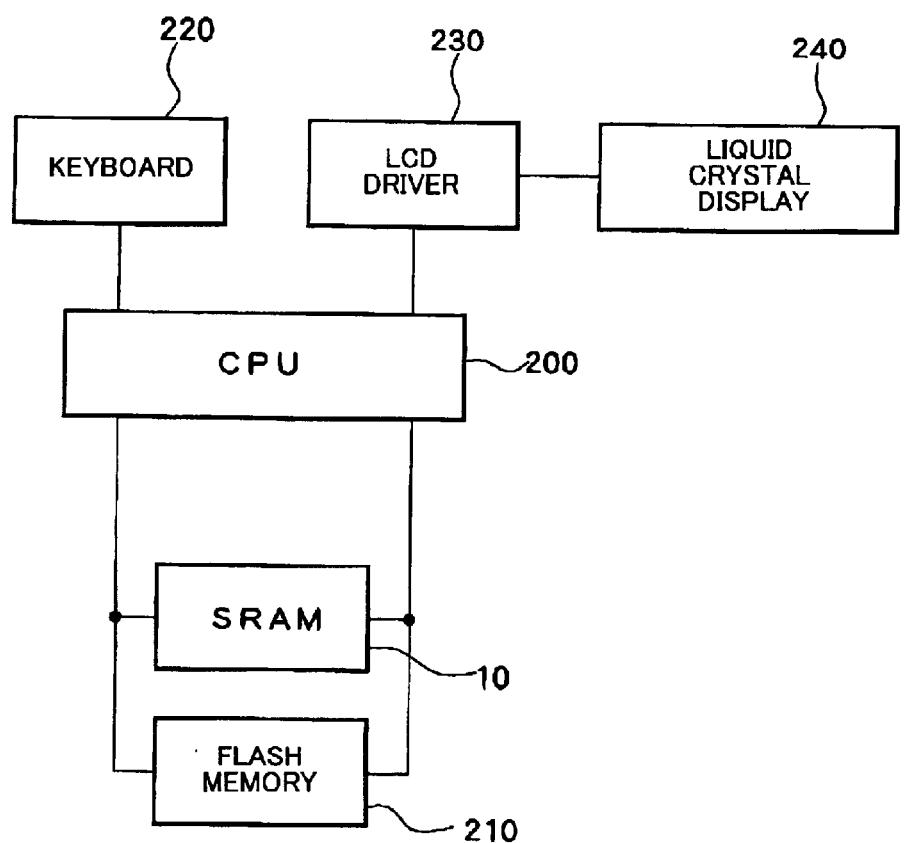
FIG. 12 is a block diagram showing part of a portable telephone system using the semiconductor memory device of FIG. 1.

The semiconductor memory device 10 can be applied to a portable electronic instrument, for example. FIG. 12 is a block diagram showing part of a system for a portable telephone. The semiconductor memory device 10 is an SRAM. A CPU 200, an SRAM 10, and a flash memory 210 are connected through a bus line. The CPU 200, SRAM 10, and flash memory 210 are connected through the bus line for transferring address signals $A_0$ to $A_{19}$, data signals $I/O_0$ to $I/O_{15}$, and commands. The CPU 200 is connected with a keyboard 220 and an LCD driver 230 through the bus line. The LCD driver 230 is connected with a liquid crystal display section 240 through the bus line. The CPU 200, SRAM 10, and flash memory 210 make up a memory system.

Figure 13:
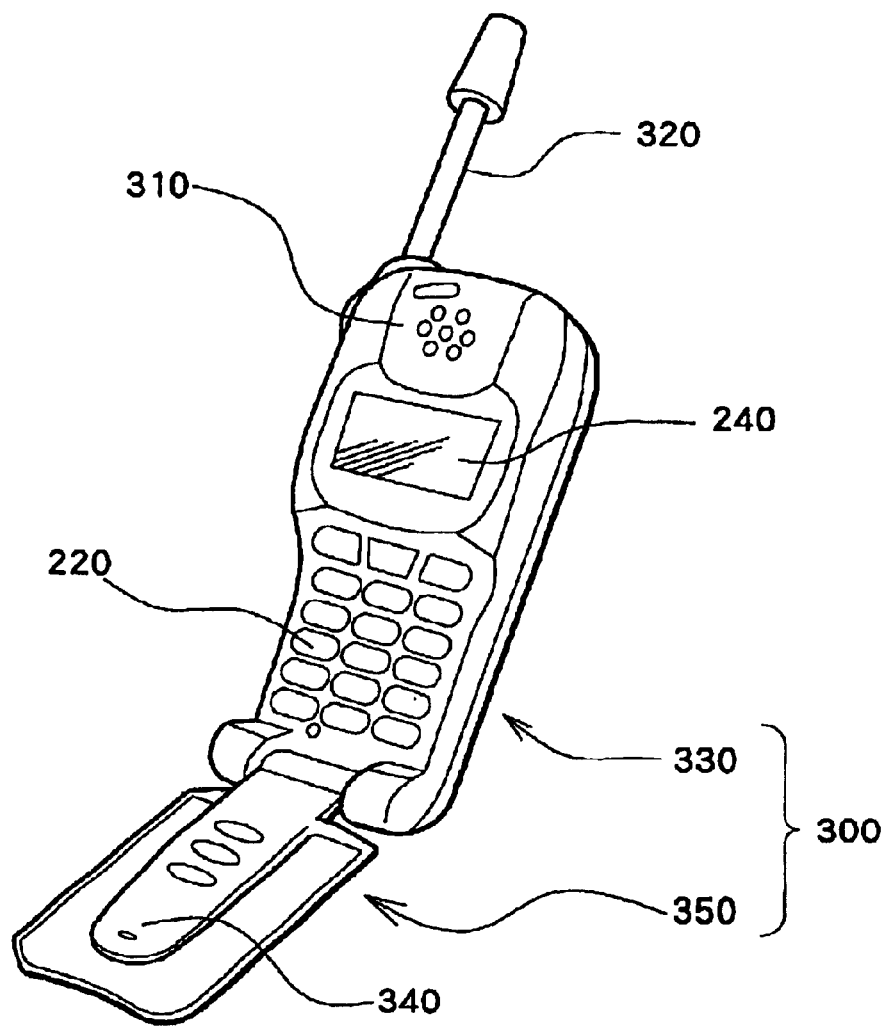
FIG. 13 is a perspective view showing a portable telephone having the system shown in FIG. 12.

FIG. 13 is a perspective view showing a portable telephone 300 using the portable telephone system shown in FIG. 12. The portable telephone 300 includes the keyboard 220, the liquid crystal display section 240, a body section 330 including a receiver section 310 and an antenna section 320, and a cover section 350 including a transmitter section 340.

The present invention is not limited to the above-described embodiments, and various modifications can be made within the scope of the invention. For example, the present invention is applicable not only to the SRAM, but also to other semiconductor memory devices in which a memory cell is selected by using a main word line and a sub word line.

What is claimed is:

1. A semiconductor memory device comprising:
   a memory cell array;
   a plurality of main word lines extending along a first direction in the memory cell array;
   a row decoder which selects one of the main word lines;
   a plurality of memory blocks formed by dividing the memory cell array in a first direction;
   a plurality of sub word lines disposed in each of the plurality of memory blocks and subordinate to each of the main word lines;
   a plurality of sub row decoders respectively provided for the memory blocks, each of the sub row decoders having a plurality of sub word select signal lines extending along a second direction which intersects the first direction to select one of the sub word lines;
   a first signal supply section which is disposed on one end in the second direction and supplies a plurality of sub word select signals to the sub word select signal lines in each of the sub row decoders; and
   a second signal supply section which is disposed on the other end in the second direction and supplies the sub word select signals to the sub word select signal lines in each of the sub row decoders.

2. The semiconductor memory device as defined in claim 1,
   wherein a block select signal line is provided along the second direction for each of the sub row decoders, the block select signal line being set to an active potential in response to selection of one of the memory blocks corresponding to each of the sub row decoders; and
   wherein the second signal supply section sets one of the sub word select signal lines provided for one of the sub row decoders to the active potential, based on logic between the block select signal line and a plurality of predecoded signal lines used to select one of the sub word lines.

3. The semiconductor memory device as defined in claim 1,
   wherein the sub word select signal lines are cut at a given position in the second direction.

4. The semiconductor memory device as defined in claim 3,
   wherein a first length from the first signal supply section to the cutting position is different from a second length from the second signal supply section to the cutting position.

5. The semiconductor memory device as defined in claim 4,
   wherein the first length is determined based on the size of a transistor which makes up the first signal supply section, and load resistance and load capacitance of the sub word select signal lines having the first length; and
   wherein the second length is determined based on the size of a transistor which makes up the second signal supply section and load resistance and load capacitance of the sub word select signal line having the second length.

6. The semiconductor memory device as defined in claim 5,
   wherein the resistance value per unit length of the sub word select signal lines is set higher in a region between the first signal supply section and the sub row decoders than other regions.

7. The semiconductor memory device as defined in claim 6,
   wherein a plurality of fuse elements for switching from a defective memory cell to a redundant memory cell are disposed between the first signal supply section and the sub row decoders, each of the sub word select signal lines having a high resistance layer which is disposed below the fuse elements to avoid contact with the fuse elements.

8. The semiconductor memory device as defined in claim 5,
   wherein the first length is shorter than the second length.

9. The semiconductor memory device as defined in claim 2,
   wherein the second signal supply section has a self-amplifying circuit which self-amplifies the potential of the block select signal line; and
   wherein the self-amplifying circuit sets the block select signal line at the active potential based on the potential change on the block select signal line.

10. The semiconductor memory device as defined in claim 9,
    wherein the self-amplifying circuit includes:
    a first potential setting section which sets the block select signal line at the active potential;
    a first switching element provided between the first potential setting section and the block select signal line; and
    a first switch control section which turns ON or OFF the first switching element based on the potential change on the block select signal line.

11. The semiconductor memory device as defined in claim 10,
    wherein the self-amplifying circuit includes:
    a second potential setting section which sets the block select signal line at a non-active potential; and
    a second switching element provided between the second potential setting section and the block select signal line, the second switching element being turned ON within a predetermined time period at least before the first switching element is turned ON.

12. The semiconductor memory device as defined in claim 11,
    wherein the self-amplifying circuit further includes a third switching element provided between the first switching element and the block select signal line, the third switching element being turned OFF within a time period in which the second switching element is turned ON.

13. The semiconductor memory device as defined in claim 11,
    wherein the second switching element of the self-amplifying circuit is turned ON based on an address transition detection signal which becomes active for a predetermined time period every time an address for selecting a memory cell in the memory cell array is changed.

14. The semiconductor memory device as defined in claim 10, wherein the first switch control section includes a first inverter which logically inverts the potential of the block select signal line; and wherein the first switching element includes a first transistor, an output of the first inverter being supplied to a gate of the first transistor.

15. The semiconductor memory device as defined in claim 14, wherein the current drive capability of the first transistor is higher than the current drive capability of a transistor which forms the first inverter.

16. The semiconductor memory device as defined in claim 14, wherein the self-amplifying circuit further includes a second switch control section which turns ON or OFF the second switching element based on the potential change on the block select signal line.

17. The semiconductor memory device as defined in claim 16, wherein the second switch control section includes a second inverter which logically inverts the potential of the block select signal line; and wherein the second switching element includes a second transistor, an output of the second inverter is supplied to a gate of the second transistor.

18. The semiconductor memory device as defined in claim 17, wherein the current drive capability of the second transistor is higher than the current drive capability of a transistor which forms the second inverter.

19. The semiconductor memory device as defined in claim 17, wherein the logic level of the first inverter is lower than the logic level of the second inverter.

20. An electronic instrument comprising the semiconductor memory device as defined in claim 1.

* * * * *